United States Patent
Gudem et al.

(10) Patent No.: US 8,565,669 B2
(45) Date of Patent: Oct. 22, 2013

(54) METHODS AND APPARATUS FOR POWER REDUCTION IN A TRANSCEIVER

(75) Inventors: Prasad S Gudem, San Diego, CA (US); Steven C Ciccarelli, San Diego, CA (US); Ken Tsz Kin Mok, San Diego, CA (US); Sai C. Kwok, Escondido, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 1268 days.

(21) Appl. No.: 12/131,800

(22) Filed: Jun. 2, 2008

(65) Prior Publication Data

US 2009/0298415 A1 Dec. 3, 2009

(51) Int. Cl.
*H04K 3/00* (2006.01)

(52) U.S. Cl.
USPC ............ 455/1; 455/67.11; 455/296; 327/170; 330/289; 330/291

(58) Field of Classification Search
USPC ........... 455/214, 336, 130, 136, 126.1, 226.1, 455/67.11, 246, 296, 230, 234, 127.1, 334; 327/538, 170, 530, 534–536, 541; 375/297, 308; 330/296, 285, 129, 130, 330/136, 289, 291
See application file for complete search history.

(56) References Cited

U.S. PATENT DOCUMENTS

| | | | |
|---|---|---|---|
| 5,648,766 A | 7/1997 | Stengel et al. | |
| 6,937,102 B2 | 8/2005 | Lopez et al. | |
| 7,130,602 B2 | 10/2006 | Ciccarelli | |
| 2005/0134336 A1 | 6/2005 | Goldblatt et al. | |
| 2006/0093064 A1 | 5/2006 | Cui | |
| 2007/0018713 A1* | 1/2007 | Tripathi et al. | 327/512 |
| 2007/0018864 A1* | 1/2007 | Khan et al. | 341/118 |
| 2007/0152739 A1 | 7/2007 | Banerjee et al. | |
| 2008/0076372 A1 | 3/2008 | Nutt | |
| 2009/0104951 A1 | 4/2009 | Nakatani et al. | |
| 2009/0254925 A1* | 10/2009 | Ayyapureddi et al. | 719/327 |

FOREIGN PATENT DOCUMENTS

| | | |
|---|---|---|
| CN | 101094016 A | 12/2007 |
| GB | 2406232 | 3/2005 |
| KR | 20050073576 A | 7/2005 |
| KR | 20070073978 A | 7/2007 |

(Continued)

OTHER PUBLICATIONS

International Search Report & Written Opinion—PCT/US2009/045971, International Search Authority—European Patent Office—Dec. 7, 2009.
Taiwan Search Report—TW098118237—TIPO—Oct. 26, 2012.

*Primary Examiner* — Sujatha Sharma
(74) *Attorney, Agent, or Firm* — William M. Hooks (57) ABSTRACT

An integrated circuit for achieving power reduction in a transceiver may include a jammer detector that determines an interference level corresponding to a received signal, and a transmit power detector that determines a required transmit power level for a transmitted signal. The integrated circuit may also include at least one of the following: a process monitor that determines process corners of components within the receiver and/or the transmitter, and a temperature monitor that determines a temperature of the receiver and/or the transmitter. The integrated circuit may also include a state machine. The state machine may transition the receiver from a high linearity mode to a low linearity mode if a set of operating conditions is satisfied. Similarly, the state machine may transition the transmitter from a high power mode to a low power mode if a set of operating conditions is satisfied.

34 Claims, 9 Drawing Sheets

(56) References Cited

FOREIGN PATENT DOCUMENTS

| RU | 2158474 | 10/2000 |
| WO | 9710644 | 3/1997 |
| WO | WO2004042937 | 5/2004 |
| WO | WO2006055792 | 5/2006 |
| WO | 2007046303 A1 | 4/2007 |

* cited by examiner

FIG. 1

| | INTERFERENCE LEVEL SIGNAL 114 | (RX) PROCESS CORNER SIGNAL 118a | (RX) TEMPERATURE SIGNAL 120a | TRANSITION TO LL MODE? |
|---|---|---|---|---|
| 262a | Low Interference | Typical/Fast Process Corners | Normal Temperature | Yes |
| 262b | Low Interference | Typical/Fast Process Corners | High Temperature | Yes |
| 262c | Low Interference | Slow Process Corners | Normal Temperature | Yes |
| 262d | Low Interference | Slow Process Corners | High Temperature | No |
| 262e | High Interference | Typical/Fast Process Corners | Normal Temperature | No |
| 262f | High Interference | Typical/Fast Process Corners | High Temperature | No |
| 262g | High Interference | Slow Process Corners | Normal Temperature | No |
| 262h | High Interference | Slow Process Corners | High Temperature | No |

FIG. 2

| TRANSMIT POWER LEVEL SIGNAL 144 | (TX) PROCESS CORNER SIGNAL 118b | (TX) TEMPERATURE SIGNAL 120b | TRANSITION TO LP MODE? |
|---|---|---|---|
| 366a — Low Transmit Power | Typical/Fast Process Corners | Normal Temperature | Yes |
| 366b — Low Transmit Power | Typical/Fast Process Corners | High Temperature | Yes |
| 366c — Low Transmit Power | Slow Process Corners | Normal Temperature | Yes |
| 366d — Low Transmit Power | Slow Process Corners | High Temperature | No |
| 366e — High Transmit Power | Typical/Fast Process Corners | Normal Temperature | No |
| 366f — High Transmit Power | Typical/Fast Process Corners | High Temperature | No |
| 366g — High Transmit Power | Slow Process Corners | Normal Temperature | No |
| 366h — High Transmit Power | Slow Process Corners | High Temperature | No |

METHODS AND APPARATUS FOR POWER REDUCTION IN A TRANSCEIVER

TECHNICAL FIELD

The present disclosure relates generally to wireless communication systems. More specifically, the present disclosure relates to methods and apparatus for power reduction in a transceiver.

BACKGROUND

Wireless communication devices have become smaller and more powerful in order to meet consumer needs and to improve portability and convenience. Consumers have become dependent upon wireless communication devices such as cellular telephones, personal digital assistants (PDAs), laptop computers, and the like. Consumers have come to expect reliable service, expanded areas of coverage, and increased functionality. A wireless communication device that is utilized by users in a wireless communication system may be referred to as a mobile station, a subscriber station, an access terminal, a remote station, a user terminal, a terminal, a subscriber unit, user equipment, etc. The term "mobile station" will be used herein.

A wireless communication system may provide communication for a number of cells, each of which may be serviced by a base station. A base station may be a fixed station that communicates with mobile stations. A base station may alternatively be referred to as an access point, a Node B, or some other terminology.

A mobile station may communicate with one or more base stations via transmissions on the uplink and the downlink. The uplink (or reverse link) refers to the communication link from the mobile station to the base station, and the downlink (or forward link) refers to the communication link from the base station to the mobile station. A wireless communication system may simultaneously support communication for multiple mobile stations.

The term "transceiver" refers to the combination of a transmitter and a receiver. A mobile station may include one or more transceivers. The transmitter portion of the transceiver within a mobile station may be used for transmitting signals to the base station via the uplink. The receiver portion of the transceiver within a mobile station may be used for receiving signals from the base station via the downlink.

Similarly, a base station may include one or more transceivers. The transmitter portion of the transceiver within a base station may be used for transmitting signals to mobile stations via the downlink. The receiver portion of the transceiver within a base station may be used for receiving signals from mobile stations via the uplink.

DETAILED DESCRIPTION

The present disclosure relates generally to transceivers, and more particularly, to power reduction in transceivers. Some existing transceivers are designed to meet worse case operating conditions. This may be beneficial under certain circumstances, such as when the received signal is very weak, there is a significant amount of interference, and the transmit output power is relatively high. However, transceivers that are designed to always meet worse case operating conditions may consume an unnecessary amount of power under favorable operating conditions.

The present disclosure relates to an intelligent transceiver that adapts to the existing operating conditions, so that the transceiver consumes an optimum amount of power based on whether the existing operating conditions are favorable or unfavorable (i.e., less power is consumed when operating conditions are favorable than when they are unfavorable).

U.S. Pat. No. 7,130,602 (the '602 patent) which is titled "Dynamically Programmable Receiver," describes a intelligent receiver that adjusts the amount of current that is used in certain circuits of the receiver based on the amount of interference that is detected. The '602 patent is assigned to the assignee of the present disclosure.

One factor to consider in relation to achieving power reduction in a transceiver relates to the operational characteristics of transceiver components. As a result of variations in the manufacturing process, different transceiver components are produced with different operational characteristics. The term "process corner" refers generally to a particular set of conditions related to processing involved in the manufacture of an integrated circuit. More specifically, a process corner is a combination of process parameter extremes.

There are different types of process corners, including fast process corners, typical process corners, and slow process corners. If the components within an integrated circuit correspond to a fast process corner, the components in the integrated circuit have a level of performance that exceeds expectations. Conversely, if the components within an integrated circuit correspond to a slow process corner, the components in the integrated circuit have level of performance that does not meet expectations. If the components within an integrated circuit correspond to a typical process corner, the components in the integrated circuit achieve about the level of performance that was expected.

When transceivers are produced in large volumes, it is likely that some of the transceivers are going to have components that correspond to slow process corners. These transceivers may require a higher amount of current to function properly than transceivers that have components corresponding to typical or fast process corners. While the percentage of transceivers that have components corresponding to slow process corners may be relatively small, it is generally not cost effective to simply discard these transceivers. Because of this, the power dissipation in all transceivers (including transceivers with components corresponding to typical and fast process corners) would have to be increased without the techniques described herein. This would result in a significant increase in power consumption of the transceivers.

Another factor to consider in relation to achieving power reduction in a transceiver relates to the temperature at which the transceiver is currently operating. Some transceivers may be designed so that they will function properly at very high temperatures (in fact, this is a requirement of many existing standards). However, transceivers may not experience such high temperatures during typical operation.

The power reduction techniques described herein may take into consideration whether the components of the transceiver correspond to slow process corners. Alternatively, or in addition, the power reduction techniques described herein may take into consideration the temperature at which the transceiver is currently operating.

In accordance with the present disclosure, an integrated circuit for achieving power reduction in a receiver may include a jammer detector that determines an interference level. The integrated circuit may also include at least one of the following: a process monitor that determines process corners of components within the receiver, and a temperature monitor that determines a temperature of the receiver. The integrated circuit may also include a state machine that transitions the receiver from a high linearity mode to a low linearity mode if a set of operating conditions is satisfied. The set of operating conditions may depend on the interference level and at least one of the following: the process corners of the components within the receiver, and the temperature of the receiver.

In accordance with the present disclosure, an integrated circuit for achieving power reduction in a transmitter may include a transmit power detector that determines a required transmit power level for a transmitted signal. The integrated circuit may also include at least one of the following: a process monitor that determines process corners of components within the transmitter, and a temperature monitor that determines a temperature of the transmitter. The integrated circuit may also include a state machine that transitions the transmitter from a high power mode to a low power mode if a set of operating conditions is satisfied. The set of operating conditions may depend on the required transmit power level and at least one of the following: the process corners of the components within the transmitter, and the temperature of the transmitter.

In accordance with the present disclosure, a method for achieving power reduction in a receiver may include determining an interference level. The method may also include at least one of the following: determining process corners of components within the receiver, and determining a temperature of the receiver. The method may also include transitioning the receiver from a high linearity mode to a low linearity mode if a set of operating conditions is satisfied. The set of operating conditions may depend on the interference level and at least one of the following: the process corners of the components within the receiver, and the temperature of the receiver.

In accordance with the present disclosure, a method for achieving power reduction in a transmitter may include determining a required transmit power level for a transmitted signal. The method may also include at least one of the following: determining process corners of components within the transmitter, and determining a temperature of the transmitter. The method may also include transitioning the transmitter from a high power mode to a low power mode if a set of operating conditions is satisfied. The set of operating conditions may depend on the required transmit power level and at least one of the following: the process corners of the components within the transmitter, and the temperature of the transmitter.

In accordance with the present disclosure, an apparatus for achieving power reduction in a receiver may include means for determining an interference level. The apparatus may also include at least one of the following: means for determining process corners of components within the receiver, and means for determining a temperature of the receiver. The apparatus may also include means for transitioning the receiver from a high linearity mode to a low linearity mode if a set of operating conditions is satisfied. The set of operating conditions may depend on the interference level and at least one of the following: the process corners of the components within the receiver, and the temperature of the receiver.

In accordance with the present disclosure, an apparatus for achieving power reduction in a transmitter may include means for determining a required transmit power level for a transmitted signal. The apparatus may also include at least one of the following: means for determining process corners of components within the transmitter, and means for determining a temperature of the transmitter. The apparatus may also include means for transitioning the transmitter from a high power mode to a low power mode if a set of operating conditions is satisfied. The set of operating conditions may depend on the required transmit power level and at least one of the following: the process corners of the components within the transmitter, and the temperature of the transmitter.

In accordance with the present disclosure, a computer-program product for achieving power reduction in a receiver may include a computer readable medium having instructions thereon. The instructions may include code for determining an interference level. The instructions may also include at least one of the following: code for determining process corners of components within the receiver, and code for determining a temperature of the receiver. The instructions may also include code for transitioning the receiver from a high linearity mode to a low linearity mode if a set of operating conditions is satisfied. The set of operating conditions may depend on the interference level and at least one of the following: the process corners of the components within the receiver, and the temperature of the receiver.

In accordance with the present disclosure, a computer-program product for achieving power reduction in a transmitter may include a computer readable medium having instructions thereon. The instructions may include code for determining a required transmit power level for a transmitted signal. The instructions may also include at least one of the following: code for determining process corners of components within the transmitter, and code for determining a temperature of the transmitter. The instructions may also include code for transitioning the transmitter from a high power mode to a low power mode if a set of operating conditions is satisfied. The set of operating conditions may depend on the required transmit power level and at least one of the following: the process corners of the components within the transmitter, and the temperature of the transmitter.

Figure 1:
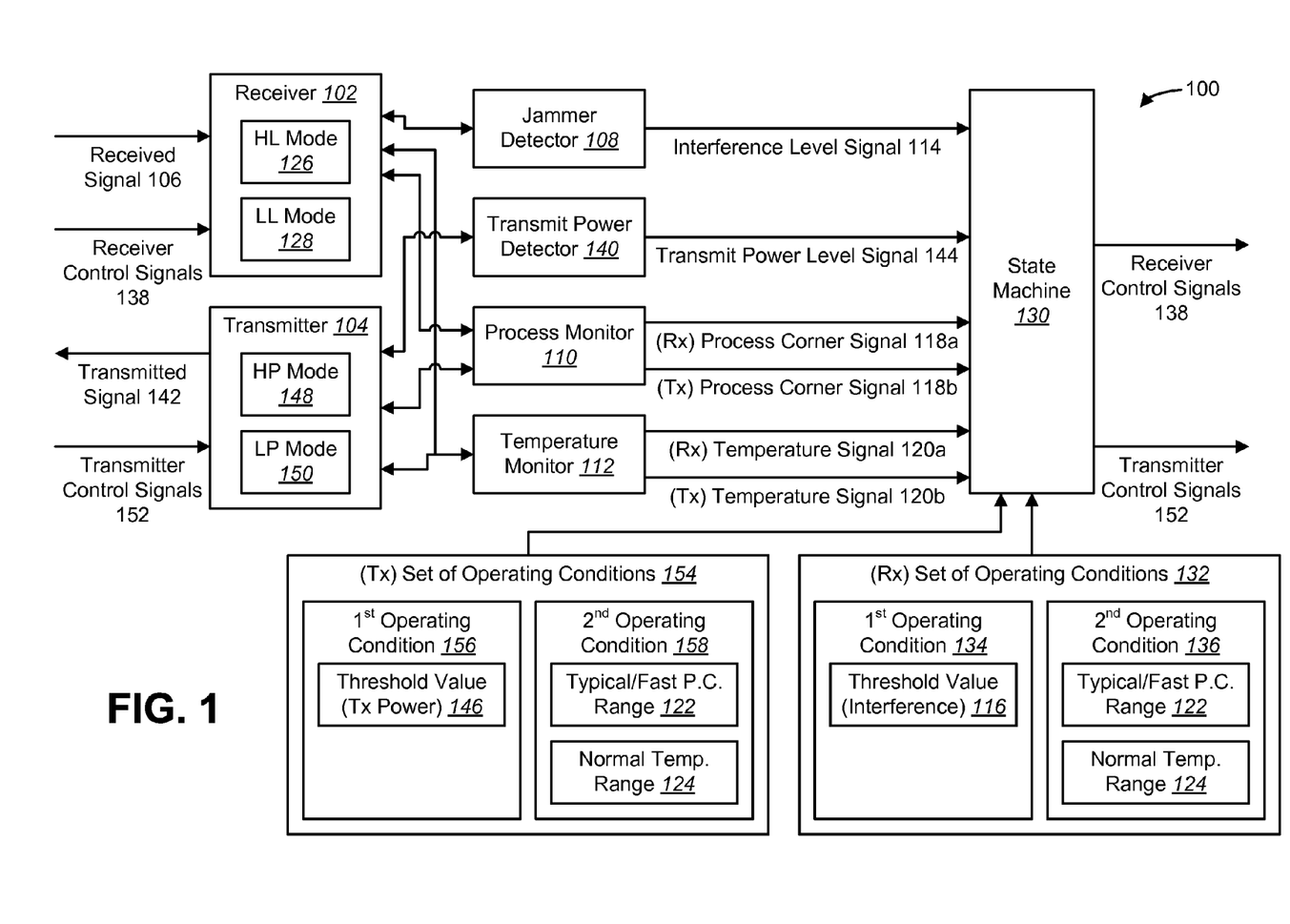
FIG. 1 illustrates examples of various functional blocks within a transceiver integrated circuit that may operate to achieve power reduction in accordance with the present disclosure.

FIG. 1 illustrates examples of various functional blocks within a transceiver integrated circuit 100 that may operate to achieve power reduction in accordance with the present disclosure. The transceiver integrated circuit 100 is shown with a receiver 102 and with a transmitter 104.

Power reduction may be achieved with respect to the operation of the receiver 102, and also with respect to the operation of the transmitter 104. Examples of techniques for achieving power reduction with respect to the operation of the receiver 102 will be described first.

The receiver 102 receives a wireless communication signal 106 via a communication channel. A jammer detector 108 may determine the current level of interference that is present in the communication channel. As used herein, the term "interference" should be interpreted broadly to refer to any interaction between the received signal 106 and other signal(s) that may cause the receiver 102 to experience a loss of quality with respect to the received signal 106. In some cases, interference may cause the receiver 102 to lose the received signal 106 entirely.

The jammer detector 108 may output a signal 114 that indicates whether the level of interference exceeds a threshold value 116. This signal 114 may be referred to herein as an interference level signal 114.

A process monitor 110 may monitor the receiver 102 to determine whether components within the receiver 102 correspond to typical or fast process corners, as opposed to slow process corners. If the components within the receiver 102 correspond to typical or fast process corners, the operational characteristics of the components in the receiver 102 have a level of performance that meets or exceeds what was expected. However, if the components within the receiver 102 correspond to slow process corners, the operational characteristics of the components in the receiver 102 have a level of performance that does not achieve what was expected. The process monitor 110 may include a transistor monitor, a resistor-capacitor monitor, and a resistor monitor.

The process monitor 110 may output a signal 118a that indicates whether components within the receiver 102 correspond to typical/fast process corners. This signal 118a may be referred to herein as a process corner signal 118a. More specifically, there may be a defined range 122 of process corners that are considered to be typical or fast process corners (i.e., not slow process corners). This range 122 may be referred to as a typical/fast process corner range 122. The process corner signal 118a may indicate whether components of the receiver 102 correspond to process corners that are within this defined typical/fast process corner range 122.

A temperature monitor 112 may monitor the receiver 102 to determine whether the temperature of the receiver 102 is within a defined normal temperature range 124. This normal temperature range 124 may correspond to normal operation of the receiver 102 (e.g., between 0° C. and 55° C.). The temperature monitor 112 may output a signal 120a that indicates whether the temperature of the receiver 102 is within this defined normal temperature range 124. This signal 120a may be referred to as a temperature signal 120.

The receiver 102 may be configured for at least two modes of operation: a high linearity (HL) mode 126, and a low linearity (LL) mode 128. The receiver 102 may operate in the high linearity mode 126 under unfavorable conditions. When conditions are more favorable, the receiver 102 may operate in the low linearity mode 128. The receiver 102 may use more power in the high linearity mode 126 than in the low linearity mode 128.

A state machine 130 may transition the receiver 102 from the high linearity mode 126 to the low linearity mode 128 if a set of operating conditions 132 is satisfied. This set of operating conditions 132 may include a first operating condition 134 and a second operating condition 136.

The first operating condition 134 may be that the level of interference does not exceed the defined threshold value 116.

As indicated above, the jammer detector 108 may output an interference level signal 114 that indicates whether the level of interference exceeds this threshold value 116.

The second operating condition 136 may be that either of the following is true: (1) components of the receiver 102 correspond to process corners that are within the defined typical/fast process corner range 122 (i.e., they do not correspond to slow process corners), and/or (2) the temperature of the receiver 102 is within the defined normal temperature range 124. As indicated above, the process monitor 110 may output a process corner signal 118a that indicates whether components within the receiver 102 correspond to process corners that are within the defined typical/fast process corner range 122. The temperature monitor 112 may output a temperature signal 120a that indicates whether the temperature of the receiver 102 is within the normal temperature range 124.

If both the first operating condition 134 and the second operating condition 136 are satisfied, then the state machine 130 may transition the receiver 102 from the high linearity mode 126 to the low linearity mode 128. This may involve sending control signals 138 to various components of the receiver 102. These control signals 138 may be referred to as receiver control signals 138.

Examples of techniques for achieving power reduction with respect to the operation of the transmitter 104 will now be described. These techniques are similar in many respects to the techniques described above for achieving power reduction with respect to the operation of the receiver 102.

A transmit power detector 140 may determine the required transmit power level for a signal 142 that is transmitted by the transmitter 104. The transmit power detector 140 may output a signal 144 that indicates whether the required transmit power level for the transmitted signal 142 exceeds a threshold value 146. This signal 144 may be referred to herein as a transmit power level signal 144.

The process monitor 110 may monitor the transmitter 104 to determine whether components within the transmitter 104 correspond to typical or fast process corners, as opposed to slow process corners. The process monitor 110 may output a process corner signal 118b that indicates whether components within the transmitter 104 correspond to typical/fast process corners.

The temperature monitor 112 may monitor the transmitter 104 to determine whether the temperature of the transmitter 104 is within the defined normal temperature range 124. The temperature monitor 112 may output a temperature signal 120b that indicates whether the temperature of the transmitter 104 is within this defined normal temperature range 124.

The transmitter 104 may be configured for at least two modes of operation: a high power (HP) mode 148, and a low power (LP) mode 150. The transmitter 104 may operate in the high power mode 148 under unfavorable conditions. When conditions are more favorable, the transmitter 104 may operate in the low power mode 150. As the name implies, the transmitter 104 may use more power in the high power mode 148 than in the low power mode 150.

The state machine 130 may transition the transmitter 104 from the high power mode 148 to the low power mode 150 if a set of operating conditions 154 is satisfied. This set of operating conditions 154 may include a first operating condition 156 and a second operating condition 158.

The first operating condition 156 may be that the required transmit power level for the transmitted signal 142 does not exceed the threshold value 146. As indicated above, the transmit power detector 140 may output a transmit power level signal 144 that indicates whether the required transmit power level for the transmitted signal 142 exceeds the threshold value 146.

The second operating condition 158 may be that either of the following is true: (1) components of the transmitter 104 correspond to process corners that are within the defined typical/fast process corner range 122 (i.e., they do not correspond to slow process corners), and/or (2) the temperature of the transmitter 104 is within the defined normal temperature range 124. As indicated above, the process monitor 110 may output a process corner signal 118b that indicates whether components within the transmitter 104 correspond to process corners that are within the defined typical/fast process corner range 122. The temperature monitor 112 may output a temperature signal 120b that indicates whether the temperature of the transmitter 104 is within the normal temperature range 124.

If both the first operating condition 156 and the second operating condition 158 are satisfied, then the state machine 130 may transition the transmitter 104 from the high power mode 148 to the low power mode 150. This may involve sending control signals 152 to various components of the transmitter 104. These control signals 152 may be referred to as transmitter control signals 152.

For illustration purposes, the transceiver integrated circuit 100 shown in FIG. 1 includes both a process monitor 110 and a temperature monitor 112. However, it is not necessary that both a process monitor 110 and a temperature monitor 112 be used. In accordance with the present disclosure, a process monitor 110 and/or a temperature monitor 112 may be used.

In FIG. 1, the same process monitor 110 is used for both the receiver 102 and the transmitter 104. Similarly, the same temperature monitor 112 is used for both the receiver 102 and the transmitter 104. However, this should not be construed as limiting the scope of the present disclosure. Different process monitors and/or different temperature monitors may be utilized for the receiver 102 and the transmitter 104 in accordance with the present disclosure.

The transceiver integrated circuit 100 that is depicted in FIG. 1 may be implemented in a mobile station. Alternatively, the transceiver integrated circuit 100 may be implemented in a base station.

Figure 2:
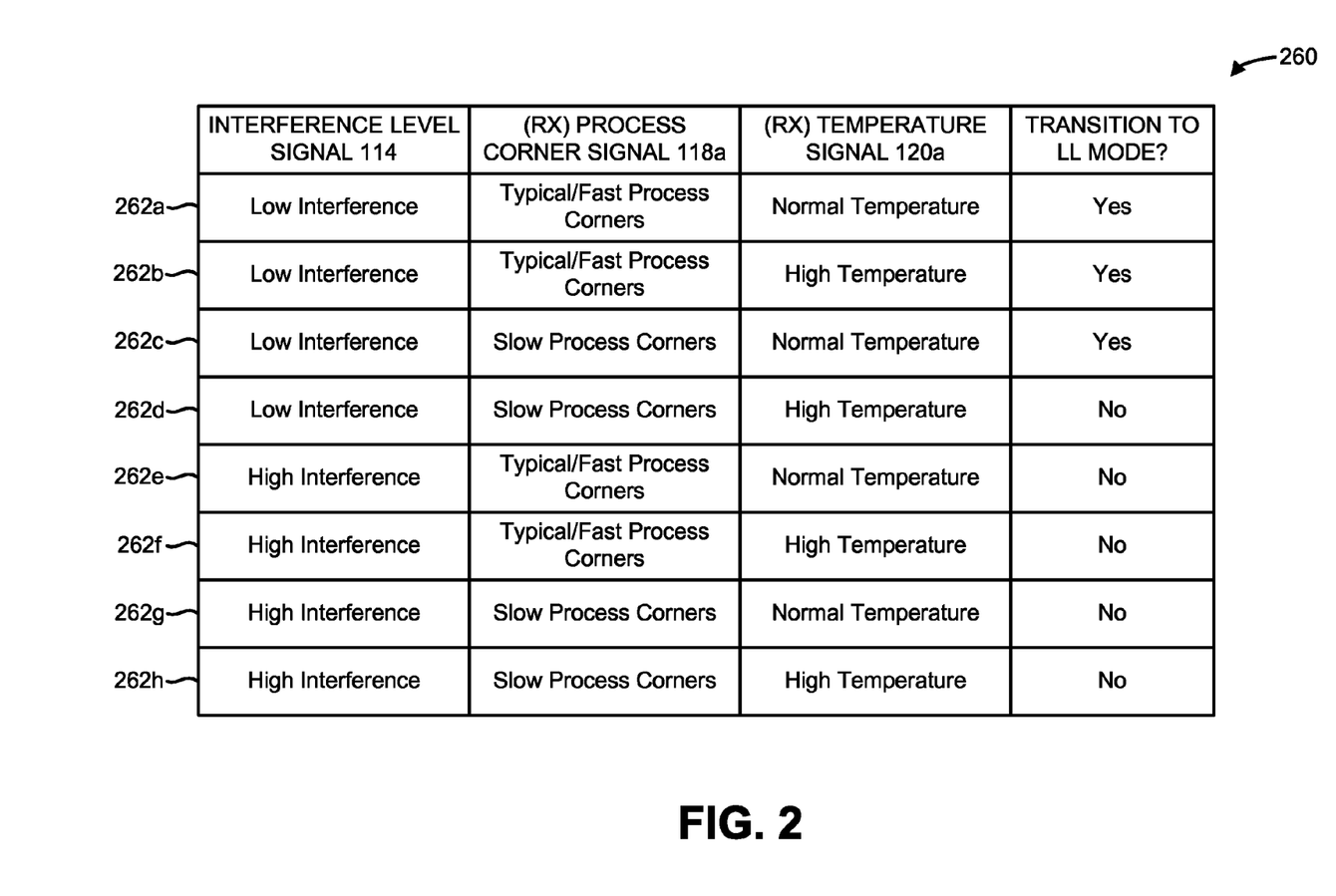
FIG. 2 illustrates an example of a truth table that summarizes the operation of the state machine with respect to the receiver in the integrated circuit shown in FIG. 1.

FIG. 2 illustrates an example of a truth table 260 that summarizes the operation of the state machine 130 with respect to the receiver 102 in the integrated circuit 100 shown in FIG. 1.

As shown in the first row 262a of the truth table 260, if the interference level signal 114 indicates that the level of interference does not exceed the threshold value 116 (i.e., low interference), the process corner signal 118a indicates that components within the receiver 102 correspond to typical/fast process corners, and the temperature signal 120a indicates that the temperature of the receiver 102 is within the defined normal temperature range 124, then the state machine 130 transitions the receiver 102 from the high linearity mode 126 to the low linearity mode 128.

As shown in the second row 262b of the truth table 260, if the interference level signal 114 indicates that the level of interference does not exceed the threshold value 116 (i.e., low interference), the process corner signal 118a indicates that components within the receiver 102 correspond to typical/fast process corners, and the temperature signal 120a indicates that the temperature of the receiver 102 is not within the defined normal temperature range 124, then the state machine 130 transitions the receiver 102 from the high linearity mode 126 to the low linearity mode 128.

As shown in the third row 262c of the truth table 260, if the interference level signal 114 indicates that the level of interference does not exceed the threshold value 116 (i.e., low interference), the process corner signal 118a indicates that components within the receiver 102 correspond to slow process corners, and the temperature signal 120a indicates that the temperature of the receiver 102 is within the defined normal temperature range 124, then the state machine 130 transitions the receiver 102 from the high linearity mode 126 to the low linearity mode 128.

As shown in the fourth row 262d of the truth table 260, if the interference level signal 114 indicates that the level of interference does not exceed the threshold value 116 (i.e., low interference), the process corner signal 118a indicates that components within the receiver 102 correspond to slow process corners, and the temperature signal 120a indicates that the temperature of the receiver 102 is not within the defined normal temperature range 124, then the state machine 130 does not transition the receiver 102 from the high linearity mode 126 to the low linearity mode 128.

As shown in the fifth row 262e, the sixth row 262f, the seventh row 262g, and the eighth row 262h of the truth table 260, if the interference level signal 114 indicates that the level of interference exceeds the threshold value 116 (i.e., high interference), then the state machine 130 does not transition the receiver 102 from the high linearity mode 126 to the low linearity mode 128, regardless of the values of the process corner signal 118a or the temperature signal 120a.

Figure 3:
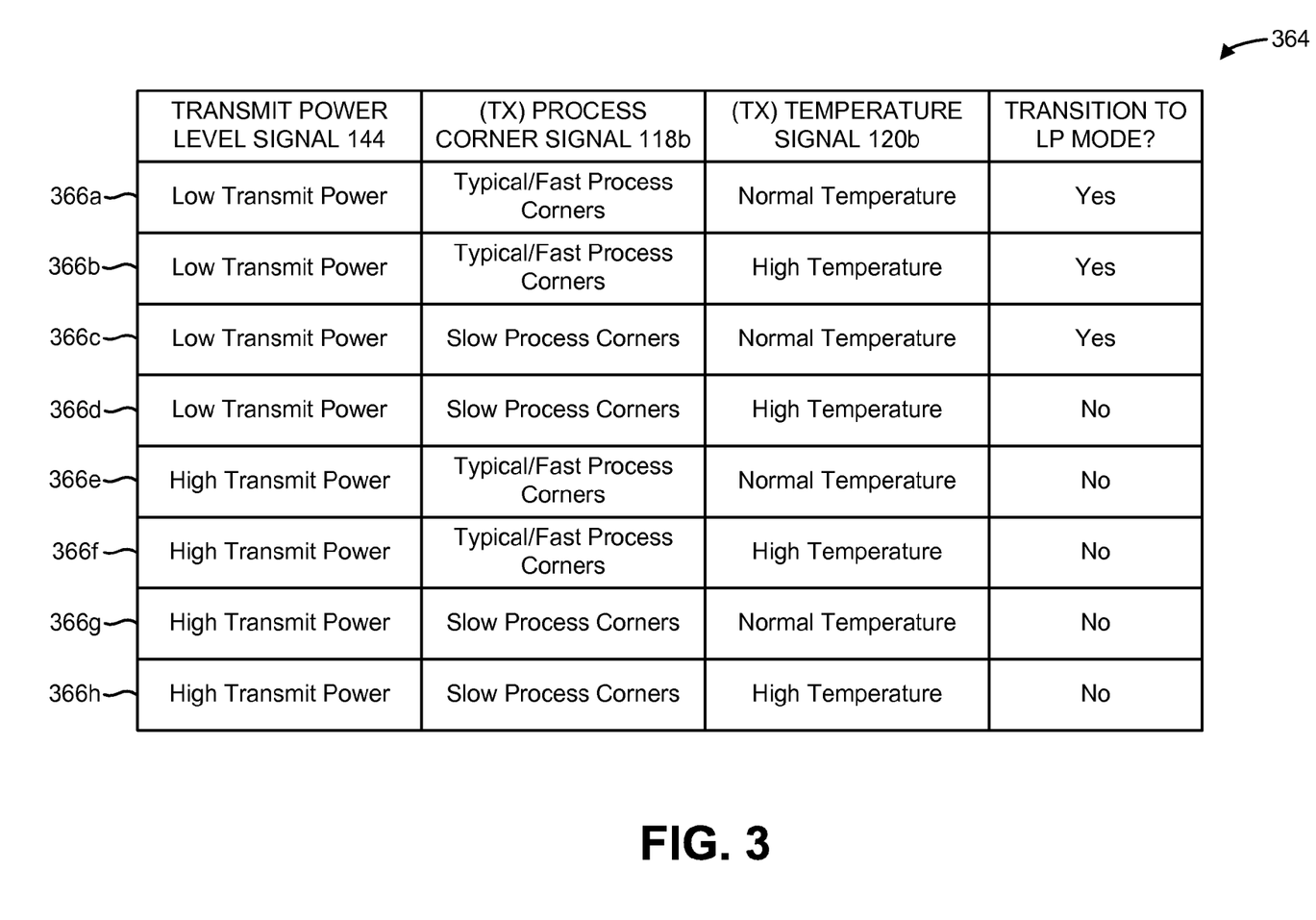
FIG. 3 illustrates an example of a truth table that summarizes the operation of the state machine with respect to the transmitter in the integrated circuit shown in FIG. 1.

FIG. 3 illustrates an example of a truth table 364 that summarizes the operation of the state machine 130 with respect to the transmitter 104 in the integrated circuit 100 shown in FIG. 1.

As shown in the first row 366a of the truth table 364, if the transmit power level signal 144 indicates that the required transmit power level for the transmitted signal 142 does not exceed the threshold value 146 (i.e., low transmit power), the process corner signal 118b indicates that components within the transmitter 104 correspond to typical/fast process corners, and the temperature signal 120a indicates that the temperature of the transmitter 104 is within the defined normal temperature range 124, then the state machine 130 transitions the transmitter 104 from the high power mode 148 to the low power mode 150.

As shown in the second row 366b of the truth table 364, if the transmit power level signal 144 indicates that the required transmit power level for the transmitted signal 142 does not exceed the threshold value 146 (i.e., low transmit power), the process corner signal 118b indicates that components within the transmitter 104 correspond to typical/fast process corners, and the temperature signal 120a indicates that the temperature of the transmitter 104 is not within the defined normal temperature range 124, then the state machine 130 transitions the transmitter 104 from the high power mode 148 to the low power mode 150.

As shown in the third row 366c of the truth table 364, if the transmit power level signal 144 indicates that the required transmit power level for the transmitted signal 142 does not exceed the threshold value 146 (i.e., low transmit power), the process corner signal 118b indicates that components within the transmitter 104 correspond to slow process corners, and the temperature signal 120a indicates that the temperature of the transmitter 104 is within the defined normal temperature range 124, then the state machine 130 transitions the transmitter 104 from the high power mode 148 to the low power mode 150.

As shown in the fourth row 366d of the truth table 364, if the transmit power level signal 144 indicates that the required transmit power level for the transmitted signal 142 does not exceed the threshold value 146 (i.e., low transmit power), the process corner signal 118b indicates that components within the transmitter 104 correspond to slow process corners, and the temperature signal 120a indicates that the temperature of the transmitter 104 is not within the defined normal temperature range 124, then the state machine 130 does not transition the transmitter 104 from the high power mode 148 to the low power mode 150.

As shown in the fifth row 366e, the sixth row 366f, the seventh row 366g, and the eighth row 366h of the truth table 364, if the transmit power level signal 144 indicates that the required transmit power level for the transmitted signal 142 exceeds the threshold value 146 (i.e., high transmit power), then the state machine 130 does not transition the transmitter 104 from the high power mode 148 to the low power mode 150, regardless of the values of the process corner signal 118b or the temperature signal 120b.

Figure 4:
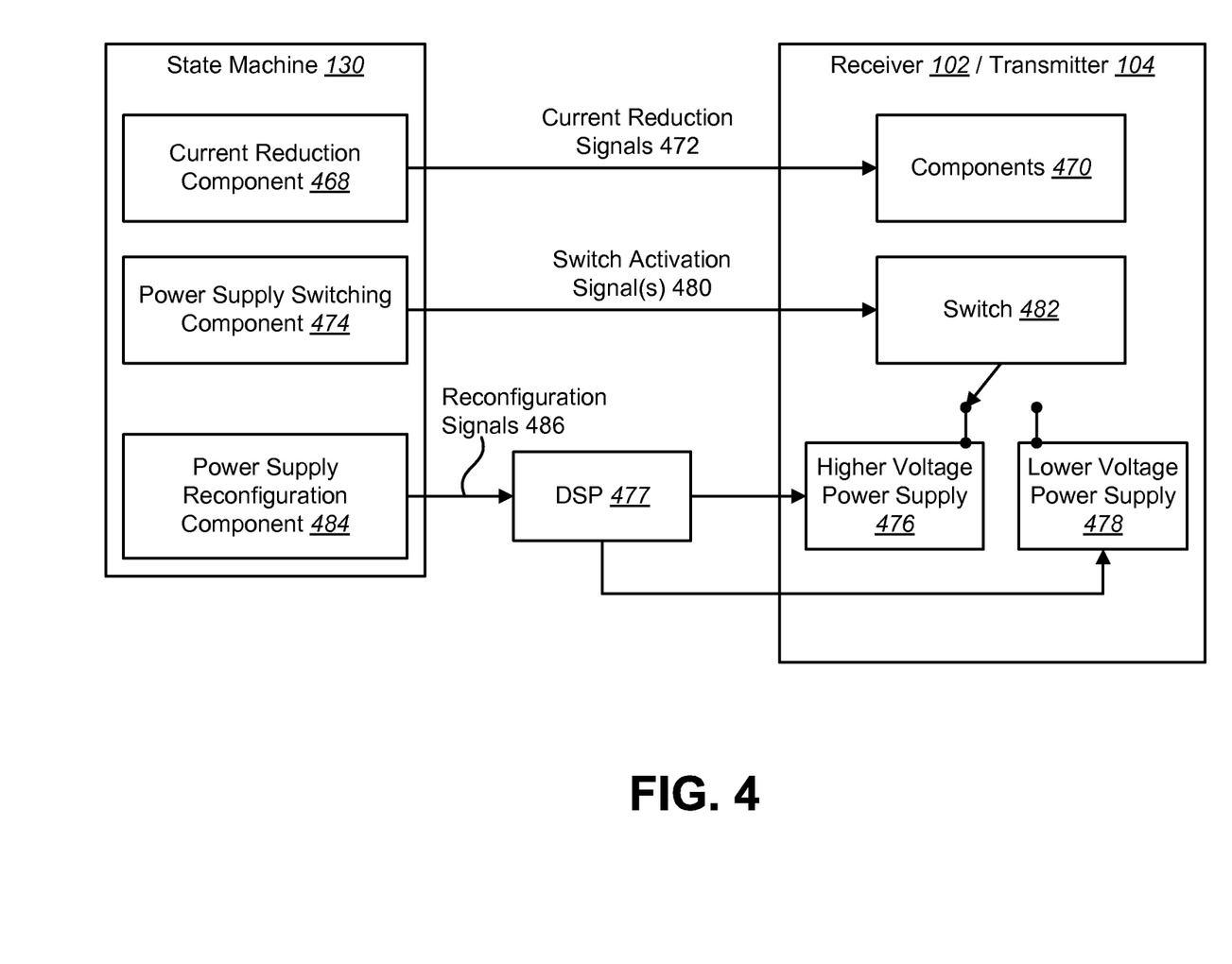
FIG. 4 illustrates an example showing how the state machine may transition the receiver from high linearity mode to low linearity mode, and how the state machine may transition the transmitter from high power mode to low power mode.

FIG. 4 illustrates an example showing how the state machine 130 may transition the receiver 102 from high linearity mode 126 to low linearity mode 128. The example shown in FIG. 4 also illustrates how the state machine 130 may transition the transmitter 104 from high power mode 148 to low power mode 150.

A current reduction component 468 may reduce current within various components 470 of the receiver 102 when the receiver 102 transitions from the high linearity mode 126 to the low linearity mode 128, and/or when the transmitter 104 transitions from the high power mode 148 to the low power mode 150. Examples of the components 470 in the receiver 102 in which the current may be reduced include low-noise amplifiers, a downconverter, a baseband filter, a receive voltage controlled oscillator, and receive local oscillator buffers/dividers. Examples of the components 470 in the transmitter 104 in which the current may be reduced include a baseband filter, an upconverter, a drive amplifier, a transmit voltage controlled oscillator, and transmit local oscillator buffers/dividers. The current reduction component 468 may send one or more control signals 472 to these components 470 to achieve this reduction in current. These control signals 472 may be referred to as current reduction signals 472.

The components 470 of the receiver 102 and/or the transmitter 104 may utilize multiple power supplies. A higher voltage power supply 476 and a lower voltage power supply 478 are shown in FIG. 4. A power supply switching component 474 may cause certain components 470 (e.g., the voltage controlled oscillator) of the receiver 102 to switch from the higher voltage power supply 476 to the lower voltage power supply 478 when the receiver 102 transitions from the high linearity mode 126 to the low linearity mode 128. Similarly, the power supply switching component 474 may cause certain components 470 (e.g., the voltage controlled oscillator) of the transmitter 104 to switch from the higher voltage power supply 476 to the lower voltage power supply 478 when the transmitter 104 transitions from the high power mode 148 to the low power mode 150.

The power supply switching component 474 may send one or more control signals 480 to a switch 482 to effect the change from the higher voltage power supply 476 to the lower voltage power supply 478. These control signals 480 may be referred to as switch activation signals 480.

A power supply reconfiguration component 484 may reduce the voltage of the power supplies 476, 478 that are being utilized by certain components 470 of the receiver 102 when the receiver 102 transitions from the high linearity mode 126 to the low linearity mode 128. Similarly, the power supply reconfiguration component 484 may reduce the voltage of the power supplies 476, 478 that are being utilized by certain components 470 of the transmitter 104 when the transmitter 104 transitions from the high power mode 148 to the low power mode 150. In other words, the higher voltage power supply 476 may be reconfigured so that its voltage is reduced, and the lower voltage power supply 478 may be reconfigured so that its voltage is also reduced.

There are many ways that the voltage of the power supplies 476, 478 may be reduced. For example, the power supply reconfiguration component 484 may send one or more control signals 486 to reduce the voltage of the power supplies 476, 478. These control signals 486 may be referred to as reconfiguration signals 486. As shown in FIG. 4, the reconfiguration signals 486 may be sent to a digital signal processor (DSP) 477, and the DSP 477 may reconfigure the power supplies 476, 478. Communication between the DSP 477 and the power supplies 476, 478 may occur via a single wire serial bus interface (SSBI). As another example, one or more analog voltage references may be provided.

Some or all of the actions shown in FIG. 4 may be performed when the receiver 102 transitions from the high linearity mode 126 to the low linearity mode 128. In other words, when the receiver 102 transitions from the high linearity mode 126 to the low linearity mode 128, the current within various components 470 of the receiver 102 may be reduced, and/or some or all of the components 470 of the receiver 102 may be switched to a lower voltage power supply 478, and/or the voltage of the power supplies 476, 478 may be reduced. In a similar manner, some or all of the actions shown in FIG. 4 may be performed when the transmitter 104 transitions from the high power mode 148 to the low power mode 150.

Figure 5:
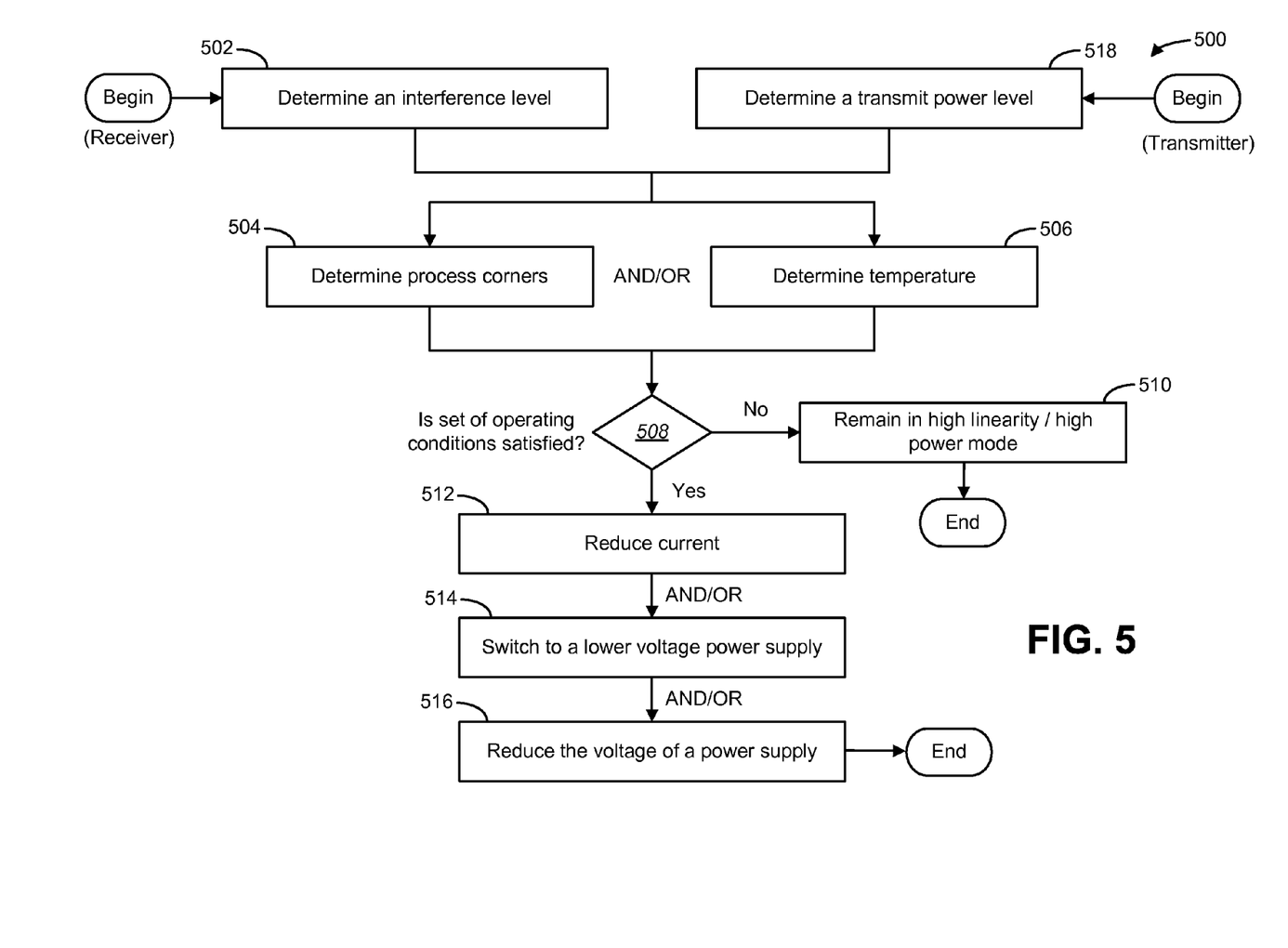
FIG. 5 illustrates an example of a method for achieving power reduction in a receiver in accordance with the present disclosure, as well as a method for achieving power reduction in a transmitter in accordance with the present disclosure.

FIG. 5 illustrates an example of a method 500 for achieving power reduction in a receiver 102 in accordance with the present disclosure.

As indicated above, the receiver 102 may receive a wireless communication signal 106 via a communication channel. The current level of interference that is present in the communication channel may be determined 502. In particular, it may be determined 502 whether the level of interference exceeds a threshold value 116.

In addition, it may be determined 504 whether components within the receiver 102 correspond to typical or fast process corners, as opposed to slow process corners. In particular, it may be determined 504 whether components of the receiver 102 correspond to process corners that are within a defined typical/fast process corner range 122. Alternatively, or in addition, it may be determined 506 whether the temperature of the receiver 102 is within a defined normal temperature range 124.

The receiver 102 may transition from a high linearity mode 126 to a low linearity mode 128 if a set of operating conditions 132 is satisfied. As discussed above, this set of operating conditions 132 may include a first operating condition 134 and a second operating condition 136. The first operating condition 134 may be that the level of interference does not exceed the defined threshold value 116. The second operating condition 136 may be that either of the following is true: (1) components of the receiver 102 correspond to process corners that are within the defined typical/fast process corner range 122 (i.e., they do not correspond to slow process corners), and/or (2) the temperature of the receiver 102 is within the defined normal temperature range 124.

If it is determined 508 that the set of operating conditions 132 is not satisfied, then the receiver 102 does not transition from the high linearity mode 126 to the low linearity mode 128. In other words, the receiver 102 remains 510 in high linearity mode 126 (assuming that the receiver 102 was in the high linearity mode 126 to begin with).

However, if it is determined 508 that the set of operating conditions 132 is satisfied, then the receiver 102 does transition from the high linearity mode 126 to the low linearity mode 128. This may involve reducing 512 current within various components 470 of the receiver 102. Alternatively, or in addition, transitioning from the high linearity mode 126 to the low linearity mode 128 may involve causing 514 certain components 470 of the receiver 102 to switch from a higher voltage power supply 476 to a lower voltage power supply 478. Alternatively, or in addition, transitioning from the high linearity mode 126 to the low linearity mode 128 may involve reducing 516 the voltage of one or more power supplies 476, 478 that are being utilized by certain components 470 of the receiver 102.

FIG. 5 also illustrates an example of a method 500 for achieving power reduction in a transmitter 104 in accordance with the present disclosure. The method 500 for achieving power reduction in a transmitter 104 is similar to the method 500 for achieving power reduction in a receiver 102, except for the following.

In the method 500 for achieving power reduction in a transmitter 104, the required transmit power level for a signal 142 that is transmitted by the transmitter 104 may be determined 518 (instead of determining 502 the interference level).

The state machine 130 may transition the transmitter 104 from the high power mode 148 to the low power mode 150 if a set of operating conditions 154 is satisfied. This set of operating conditions 154 may be similar to the set of operating conditions 132 for the receiver 102, except that the first operating condition 156 may be that the required transmit power level for the transmitted signal 142 does not exceed a threshold value 146.

Figure 6:
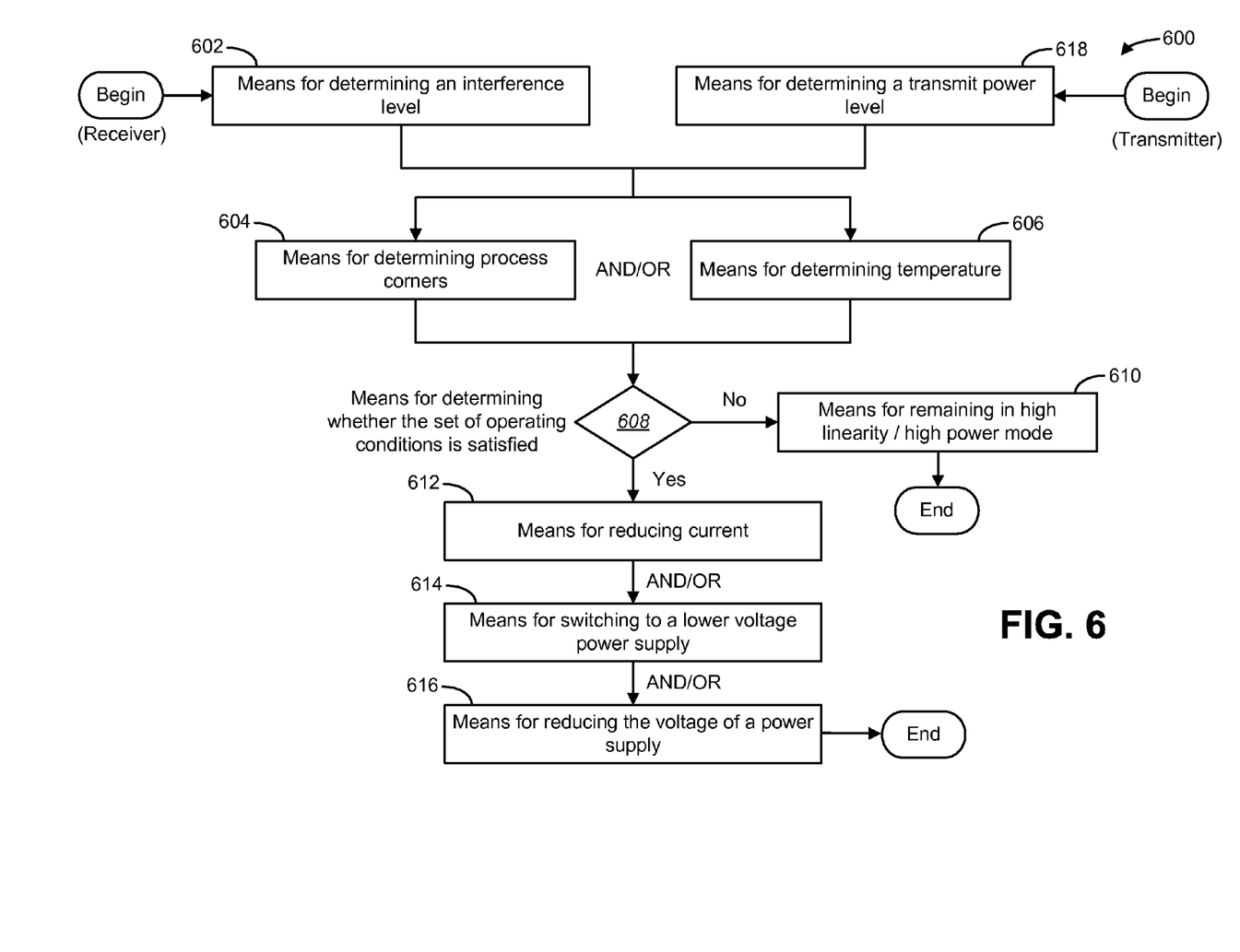
FIG. 6 illustrates means-plus-function blocks corresponding to the method of FIG. 5.

The method 500 of FIG. 5 described above may be performed by various hardware and/or software component(s) and/or module(s) corresponding to the means-plus-function blocks 600 illustrated in FIG. 6. In other words, blocks 502 through 518 illustrated in FIG. 5 correspond to means-plus-function blocks 602 through 618 illustrated in FIG. 6.

Figure 7:
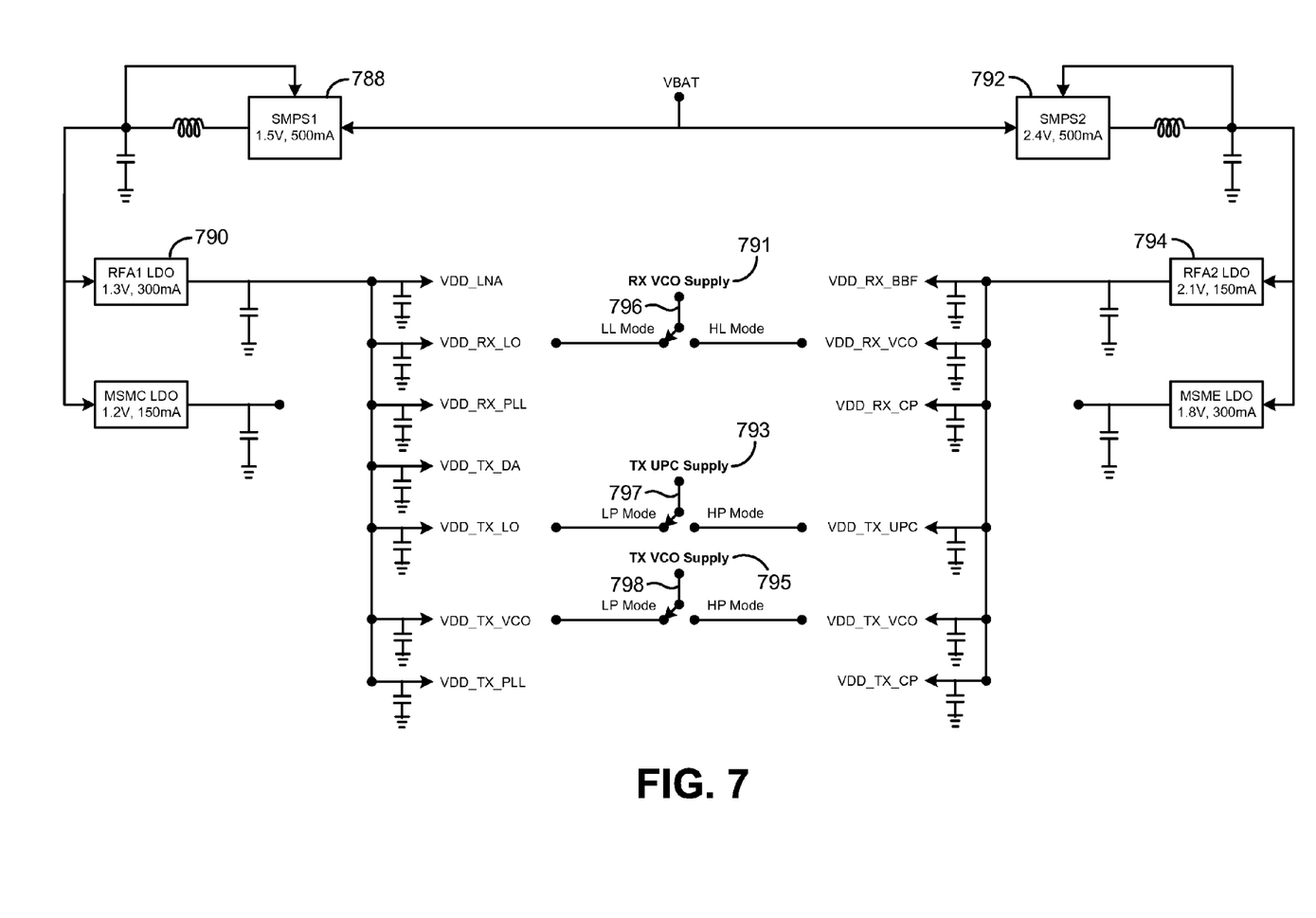
FIG. 7 illustrates an example of a power supply switching scheme in accordance with the present disclosure.

FIG. 7 illustrates an example of a power supply switching scheme in accordance with the present disclosure. In particular, FIG. 7 illustrates an example showing how at least some components of the receiver 102 may be switched from a higher voltage power supply 476 to a lower voltage power supply 478 when the receiver 102 transitions from the high linearity mode 126 to the low linearity mode 128. The example of FIG. 7 also illustrates how at least some components of the transmitter 104 may be switched from a higher voltage power supply 476 to a lower voltage power supply 478 when the transmitter 104 transitions from the high power mode 148 to the low power mode 150.

A first switched-mode power supply (SMPS) 788 is connected to a first low drop-out regulator (LDO) 790. A second SMPS 792 is connected to a second low drop-out regulator (LDO) 794. The first SMPS 788 has a lower voltage than the second SMPS 792, and the first LDO 790 has a lower voltage than the second LDO 794.

When the receiver 102 is in high linearity mode, a switch 796 connects the power supply 791 that is utilized by the voltage controlled oscillator (VCO) for the receiver 102 to the second (higher voltage) LDO 794. However, when the receiver 102 is in low linearity mode, the switch 796 connects the VCO power supply 791 to the first (lower voltage) LDO 790.

In a similar manner, when the transmitter 104 is in high power mode, a switch 797 connects a power supply 793 that is utilized by the transmitter 104 to the second (higher voltage) LDO 794. However, when the transmitter 104 is in low power mode, the switch 797 connects the power supply 793 to the first (lower voltage) LDO 790.

When the transmitter 104 is in high power mode, a switch 798 connects a power supply 795 that is utilized by the VCO of the transmitter 104 to the second (higher voltage) LDO 794. However, when the transmitter 104 is in low power mode, the switch 798 connects the power supply 795 to the first (lower voltage) LDO 790.

Figure 8:
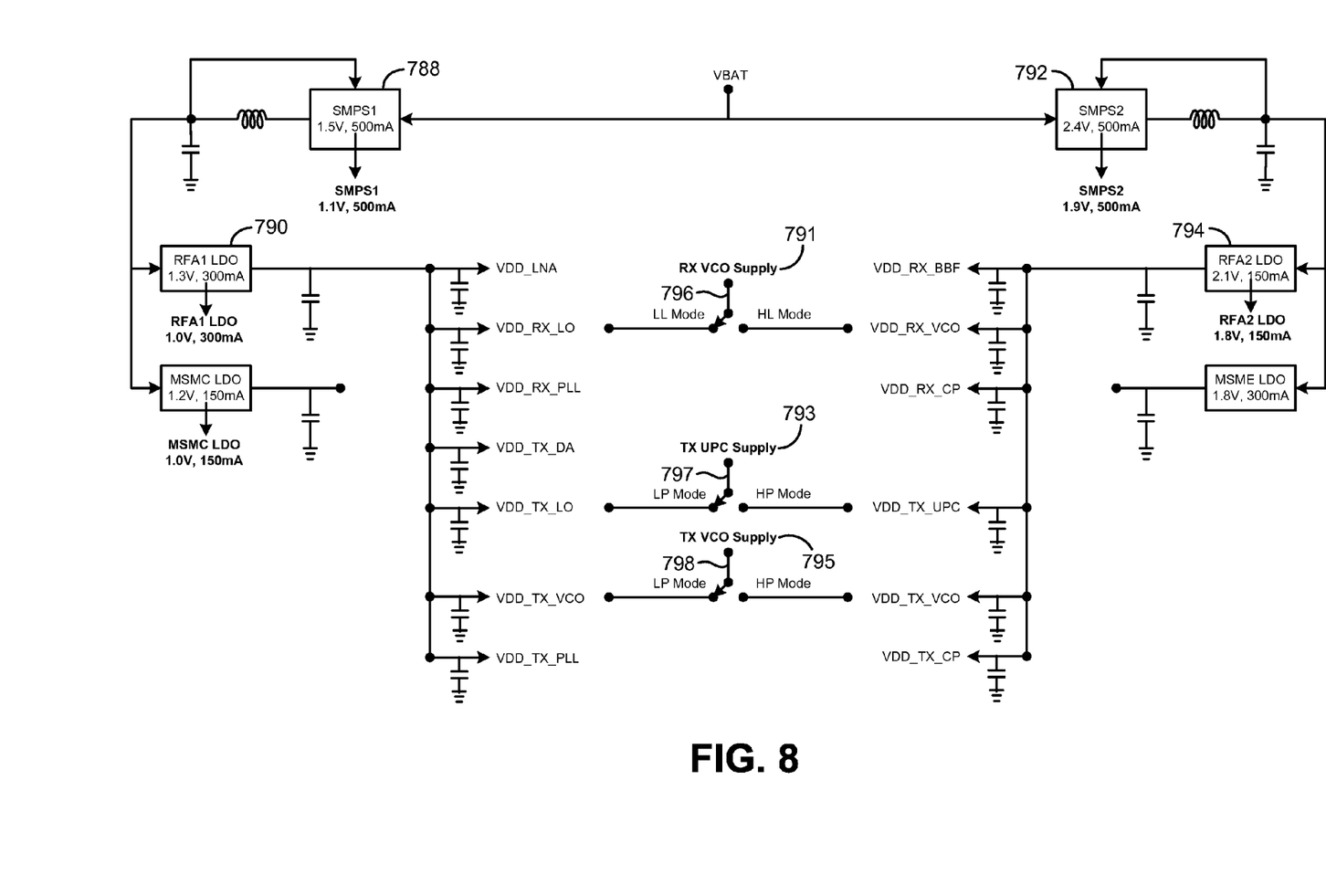
FIG. 8 illustrates an example of a power supply reduction scheme in accordance with the present disclosure.

FIG. 8 illustrates an example of a power supply reduction scheme in accordance with the present disclosure. In particular, FIG. 8 illustrates an example showing how the voltage of power supplies that are utilized by the receiver 102 may be reduced when the receiver 102 transitions from the high linearity mode to the low linearity mode. The example of FIG. 8 also illustrates how the voltage of power supplies that are utilized by the transmitter 104 may be reduced when the transmitter 104 transitions from the high power mode to the low power mode.

The switches 796, 797, and 798 may operate in the same manner as was described above in relation to FIG. 7. In addition, however, the voltage of the first SMPS 788, the voltage of the first LDO 790, the voltage of the second SMPS 792, and the voltage of the second LDO 794 may also be reduced.

Figure 9:
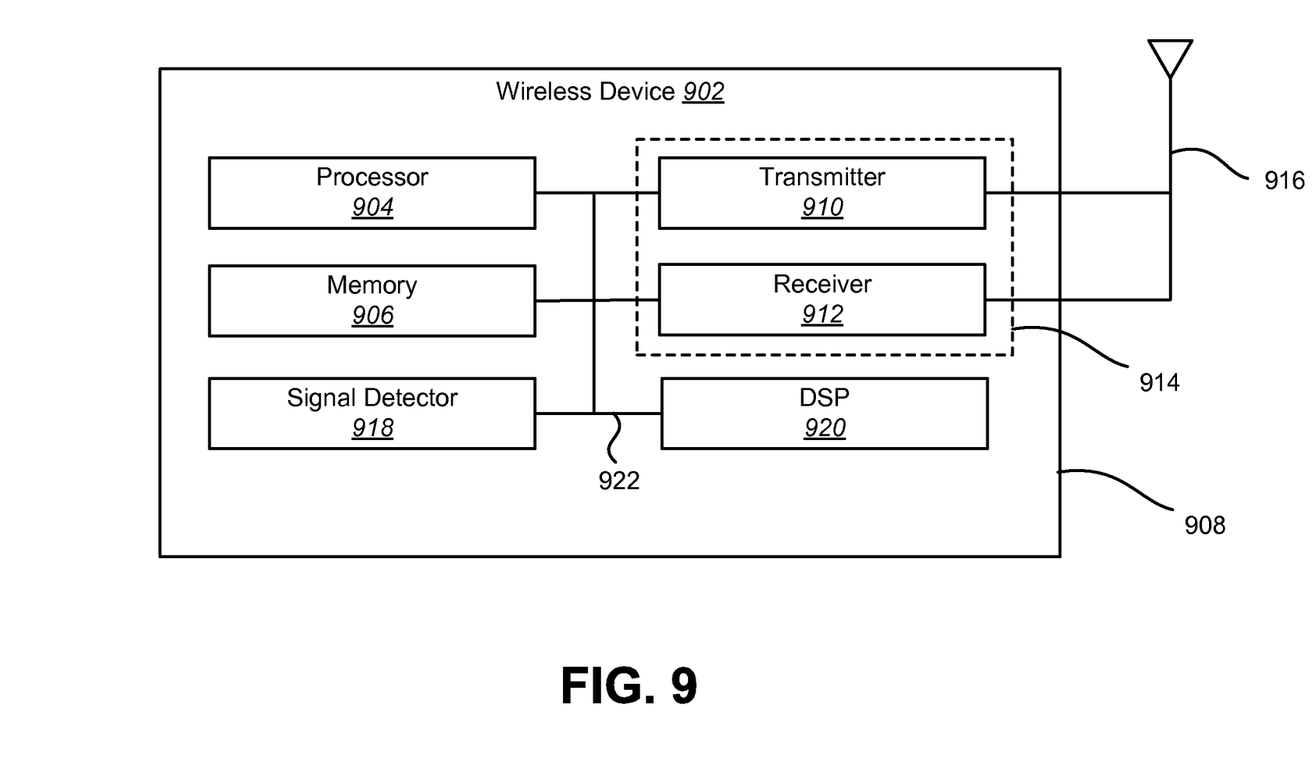
FIG. 9 illustrates various components that may be utilized in a wireless device.

FIG. 9 illustrates various components that may be utilized in a wireless device 902. The wireless device 902 is an example of a device that may include a transceiver that is configured to implement the methods described herein. The wireless device 902 may be a base station or a mobile station.

The wireless device 902 may include a processor 904 which controls operation of the wireless device 902. The processor 904 may also be referred to as a central processing unit (CPU). Memory 906, which may include both read-only memory (ROM) and random access memory (RAM), provides instructions and data to the processor 904. A portion of the memory 906 may also include non-volatile random access memory (NVRAM). The processor 904 typically performs logical and arithmetic operations based on program instructions stored within the memory 906. The instructions in the memory 906 may be executable to implement the methods described herein.

The wireless device 902 may also include a housing 908 that may include a transmitter 910 and a receiver 912 to allow transmission and reception of data between the wireless device 902 and a remote location. The transmitter 910 and receiver 912 may be combined into a transceiver 914. The transceiver 914 may be configured to implement the power reduction techniques described herein. An antenna 916 may be attached to the housing 908 and electrically coupled to the transceiver 914. The wireless device 902 may also include (not shown) multiple transmitters, multiple receivers, multiple transceivers and/or multiple antenna.

The wireless device 902 may also include a signal detector 918 that may be used to detect and quantify the level of signals received by the transceiver 914. The signal detector 918 may detect such signals as total energy, pilot energy per pseudonoise (PN) chips, power spectral density, and other signals. The wireless device 902 may also include a digital signal processor (DSP) 920 for use in processing signals.

The various components of the wireless device 902 may be coupled together by a bus system 922 which may include a power bus, a control signal bus, and a status signal bus in addition to a data bus. However, for the sake of clarity, the various buses are illustrated in FIG. 9 as the bus system 922.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

As discussed above, the various illustrative logical blocks, modules and circuits described in connection with the present disclosure may be implemented in an application specific integrated circuit (ASIC). Alternatively, the logical blocks, modules and circuits described herein may be implemented or performed with a field programmable gate array (FPGA) or other programmable logic device, discrete gate or transistor logic, discrete hardware components, a general purpose processor, a digital signal processor (DSP), or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

Where the steps of an algorithm described herein are implemented at least partially in software, a software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An integrated circuit for achieving power reduction in a receiver, comprising:
   a jammer detector that determines an interference level;
   at least one of the following: a process monitor that determines process corners of components within the receiver, and a temperature monitor that determines a temperature of the receiver; and
   a state machine that transitions the receiver from a high linearity mode to a low linearity mode if a set of operating conditions is satisfied, wherein the set of operating conditions depends on the interference level and at least one of the following: the process corners of the components within the receiver, and the temperature of the receiver.

2. The integrated circuit of claim 1, wherein the set of operating conditions comprises:
   a first operating condition that the interference level is below a threshold value; and
   a second operating condition that at least one of the following is true: the components of the receiver correspond to process corners that are within a defined typical/fast process corner range, and the temperature of the receiver is within a defined normal temperature range.

3. The integrated circuit of claim 1, wherein the state machine comprises a current reduction component that reduces current within at least some components of the receiver when the receiver transitions from the high linearity mode to the low linearity mode.

4. The integrated circuit of claim 1, wherein the state machine comprises a power supply switching component that switches at least some components of the receiver from a higher voltage power supply to a lower voltage power supply when the receiver transitions from the high linearity mode to the low linearity mode.

5. The integrated circuit of claim 1, wherein the state machine comprises a power supply reconfiguration component that reduces the voltage of at least one power supply that is utilized by the receiver when the receiver transitions from the high linearity mode to the low linearity mode.

6. An integrated circuit for achieving power reduction in a transmitter, comprising:
   a transmit power detector that determines a required transmit power level for a transmitted signal;
   at least one of the following: a process monitor that determines process corners of components within the transmitter, and a temperature monitor that determines a temperature of the transmitter; and a state machine that transitions the transmitter from a high power mode to a low power mode if a set of operating conditions is satisfied, wherein the set of operating conditions depends on the required transmit power level and at least one of the following: the process corners of the components within the transmitter, and the temperature of the transmitter.

7. The integrated circuit of claim 6, wherein the set of operating conditions comprises:
a first operating condition that the required transmit power level is below a threshold value; and
a second operating condition that at least one of the following is true: the components of the transmitter correspond to process corners that are within a defined typical/fast process corner range, and the temperature of the transmitter is within a defined normal temperature range.

8. The integrated circuit of claim 6, wherein the state machine comprises a current reduction component that reduces current within at least some components of the transmitter when the transmitter transitions from the high power mode to the low power mode.

9. The integrated circuit of claim 6, wherein the state machine comprises a power supply switching component that switches at least some components of the transmitter from a higher voltage power supply to a lower voltage power supply when the transmitter transitions from the high power mode to the low power mode.

10. The integrated circuit of claim 6, wherein the state machine comprises a power supply reconfiguration component that reduces the voltage of at least one power supply that is utilized by the transmitter when the transmitter transitions from the high power mode to the low power mode.

11. A method for achieving power reduction in a receiver, comprising:
determining an interference level;
at least one of the following: determining process corners of components within the receiver, and determining a temperature of the receiver; and
transitioning the receiver from a high linearity mode to a low linearity mode if a set of operating conditions is satisfied, wherein the set of operating conditions depends on the interference level and at least one of the following: the process corners of the components within the receiver, and the temperature of the receiver.

12. The method of claim 11, wherein the set of operating conditions comprises:
a first operating condition that the interference level is below a threshold value; and
a second operating condition that at least one of the following is true: the components of the receiver correspond to process corners that are within a defined typical/fast process corner range, and the temperature of the receiver is within a defined normal temperature range.

13. The method of claim 11, wherein transitioning the receiver from the high linearity mode to the low linearity mode comprises reducing current within at least some components of the receiver.

14. The method of claim 11, wherein transitioning the receiver from the high linearity mode to the low linearity mode comprises switching at least some components of the receiver from a higher voltage power supply to a lower voltage power supply.

15. The method of claim 11, wherein transitioning the receiver from the high linearity mode to the low linearity mode comprises reducing the voltage of at least one power supply that is utilized by the receiver.

16. A method for achieving power reduction in a transmitter, comprising:
determining a required transmit power level for a transmitted signal;
at least one of the following: determining process corners of components within the transmitter, and determining a temperature of the transmitter; and
transitioning the transmitter from a high power mode to a low power mode if a set of operating conditions is satisfied, wherein the set of operating conditions depends on the required transmit power level and at least one of the following: the process corners of the components within the transmitter, and the temperature of the transmitter.

17. The method of claim 16, wherein the set of operating conditions comprises:
a first operating condition that the required transmit power level is below a threshold value; and
a second operating condition that at least one of the following is true: the components of the transmitter correspond to process corners that are within a defined typical/fast process corner range, and the temperature of the transmitter is within a defined normal temperature range.

18. The method of claim 16, wherein transitioning from the high power mode to the low power mode comprises reducing current within at least some components of the transmitter.

19. The method of claim 16, wherein transitioning from the high power mode to the low power mode comprises switching at least some components of the transmitter from a higher voltage power supply to a lower voltage power supply.

20. The method of claim 16, wherein transitioning from the high power mode to the low power mode comprises reducing the voltage of at least one power supply that is utilized by the transmitter.

21. An apparatus for achieving power reduction in a receiver, comprising:
means for determining an interference level;
at least one of the following: means for determining process corners of components within the receiver, and means for determining a temperature of the receiver; and
means for transitioning the receiver from a high linearity mode to a low linearity mode if a set of operating conditions is satisfied, wherein the set of operating conditions depends on the interference level and at least one of the following: the process corners of the components within the receiver, and the temperature of the receiver.

22. The apparatus of claim 21, wherein the set of operating conditions comprises:
a first operating condition that the interference level is below a threshold value; and
a second operating condition that at least one of the following is true: the components of the receiver correspond to process corners that are within a defined typical/fast process corner range, and the temperature of the receiver is within a defined normal temperature range.

23. The apparatus of claim 21, wherein the means for transitioning the receiver from the high linearity mode to the low linearity mode comprises means for reducing current within at least some components of the receiver.

24. The apparatus of claim 21, wherein the means for transitioning the receiver from the high linearity mode to the low linearity mode comprises means for switching at least some components of the receiver from a higher voltage power supply to a lower voltage power supply.

25. The apparatus of claim 21, wherein the means for transitioning the receiver from the high linearity mode to the low linearity mode comprises means for reducing the voltage of at least one power supply that is utilized by the receiver.

26. The apparatus of claim 21, wherein the apparatus is an integrated circuit.

27. An apparatus for achieving power reduction in a transmitter, comprising:
- means for determining a required transmit power level for a transmitted signal;
- at least one of the following: means for determining process corners of components within the transmitter, and means for determining a temperature of the transmitter; and
- means for transitioning the transmitter from a high power mode to a low power mode if a set of operating conditions is satisfied, wherein the set of operating conditions depends on the required transmit power level and at least one of the following: the process corners of the components within the transmitter, and the temperature of the transmitter.

28. The apparatus of claim 27, wherein the set of operating conditions comprises:
- a first operating condition that the required transmit power level is below a threshold value; and
- a second operating condition that at least one of the following is true: the components of the transmitter correspond to process corners that are within a defined typical/fast process corner range, and the temperature of the transmitter is within a defined normal temperature range.

29. The apparatus of claim 27, wherein the means for transitioning from the high power mode to the low power mode comprises means for reducing current within at least some components of the transmitter.

30. The apparatus of claim 27, wherein the means for transitioning from the high power mode to the low power mode comprises means for switching at least some components of the transmitter from a higher voltage power supply to a lower voltage power supply.

31. The apparatus of claim 27, wherein the means for transitioning from the high power mode to the low power mode comprises means for reducing the voltage of at least one power supply that is utilized by the transmitter.

32. The apparatus of claim 27, wherein the apparatus is an integrated circuit.

33. A computer-program product for achieving power reduction in a receiver, the computer-program product comprising a non-transitory computer readable medium having instructions thereon, the instructions comprising:
- code for determining an interference level;
- at least one of the following: code for determining process corners of components within the receiver, and code for determining a temperature of the receiver; and
- code for transitioning the receiver from a high linearity mode to a low linearity mode if a set of operating conditions is satisfied, wherein the set of operating conditions depends on the interference level and at least one of the following: the process corners of the components within the receiver, and the temperature of the receiver.

34. A computer-program product for achieving power reduction in a transmitter, the computer-program product comprising a non-transitory computer readable medium having instructions thereon, the instructions comprising:
- code for determining a required transmit power level for a transmitted signal;
- at least one of the following: code for determining process corners of components within the transmitter, and code for determining a temperature of the transmitter; and
- code for transitioning the transmitter from a high power mode to a low power mode if a set of operating conditions is satisfied, wherein the set of operating conditions depends on the required transmit power level and at least one of the following: the process corners of the components within the transmitter, and the temperature of the transmitter.

* * * * *